(12) United States Patent
Lee et al.

(10) Patent No.: US 10,809,318 B2
(45) Date of Patent: Oct. 20, 2020

(54) SEMICONDUCTOR-BASED HALL SENSOR

(71) Applicant: MagnaChip Semiconductor, Ltd., Cheongju-si (KR)

(72) Inventors: Seong Woo Lee, Cheongju-si (KR); Hee Baeg An, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 855 days.

(21) Appl. No.: 14/069,430

(22) Filed: Nov. 1, 2013

(65) Prior Publication Data

US 2015/0002140 A1    Jan. 1, 2015

(30) Foreign Application Priority Data

Jun. 28, 2013  (KR) ......................... 10-2013-0075971

(51) Int. Cl.
  *G01D 5/14*      (2006.01)
  *G01R 33/07*     (2006.01)
(52) U.S. Cl.
  CPC .................................. *G01R 33/07* (2013.01)
(58) Field of Classification Search
  CPC .... G01R 33/07; G01R 33/072; G01R 33/075; G01R 33/066; G01R 15/202
  See application file for complete search history.

(56) References Cited

U.S. PATENT DOCUMENTS

| | | | |
|---|---|---|---|
| 4,660,065 A | 4/1987 | Carvajal et al. | |
| 4,782,375 A * | 11/1988 | Popovic | G01R 15/202 257/426 |
| 4,829,352 A * | 5/1989 | Popovic | H01L 27/22 257/426 |
| 5,530,345 A * | 6/1996 | Murari | G01D 5/145 257/426 |
| 5,548,151 A * | 8/1996 | Funaki | H01L 43/065 257/421 |
| 5,679,973 A * | 10/1997 | Mochizuki | H01L 43/06 257/421 |
| 6,492,697 B1 * | 12/2002 | Plagens | G01R 33/07 257/421 |
| 6,545,462 B2 | 4/2003 | Schott et al. | |
| 6,639,290 B1 | 10/2003 | Hohe et al. | |

(Continued)

FOREIGN PATENT DOCUMENTS

| | | |
|---|---|---|
| CN | 1343889 A | 4/2002 |
| CN | 102509767 A | 6/2012 |
| JP | 2012-204616 A | 10/2012 |

OTHER PUBLICATIONS

Chinese Office Action dated Oct. 10, 2017 in corresponding Chinese Patent Application No. 201310629910.1 (7 pages in Chinese).

(Continued)

*Primary Examiner* — Son T Le
*Assistant Examiner* — Adam S Clarke
(74) *Attorney, Agent, or Firm* — NSIP Law (57) ABSTRACT

There is provided a hall sensor. The hall sensor includes a hall element disposed on a semiconductor substrate. The hall element includes: a sensing region, a first electrode, a second electrode, a third electrode and a fourth electrode, and a doped region disposed on the sensing region, and the sensing region has at least one angulated corner or rounded corner.

24 Claims, 10 Drawing Sheets

(56) References Cited

U.S. PATENT DOCUMENTS

| | | | |
|---|---|---|---|
| 2002/0021124 A1* | 2/2002 | Schott | G01D 5/145 324/207.2 |
| 2004/0129934 A1* | 7/2004 | Takatsuka | H01L 43/065 257/40 |
| 2005/0230770 A1* | 10/2005 | Oohira | G01R 33/07 257/421 |
| 2011/0175605 A1* | 7/2011 | Kim | G01R 33/06 324/251 |
| 2013/0207158 A1* | 8/2013 | Arai | H01L 29/7393 257/139 |
| 2014/0210461 A1* | 7/2014 | Ausserlechner | G01R 33/075 324/251 |

OTHER PUBLICATIONS

Korean Office Action dated Feb. 21, 2019 in counterpart Korean Patent Application No. 10-2013-0075971 (7 pages in Korean).

\* cited by examiner

| Size 50x50um | Cross-shaped (prior art) | Square-shaped |
|---|---|---|
| Layout |  |  |
| Rs (ohm) | 2702 | 1884 |
| Offset Voltage | 110 uV/V | 23 uV/V |
| Hall Voltage sensitivity | 34.1 mV/VT | 32.5 mV/VT |

FIG. 3C

| Hall sensor type | | Octagon shaped | Square shaped |
|---|---|---|---|
| Layout | | | |
| R (ohm) | Median | 2687 | 1914 |
| Hall voltage | Sensitivity | 32.1 mV/VT | 38.4 mV/VT |
| | Median @ Vsense=3V | 1.64 mV | 2.12 mV |
| | sigma | 0.03 mV | 0.28 mV |

SEMICONDUCTOR-BASED HALL SENSOR

CROSS-REFERENCE TO RELATED APPLICATIONS

This application claims the benefit under 35 U.S.C. §119(a) of Korean Patent Application No. 10-2013-0075971, filed on Jun. 28, 2013, in the Korean Intellectual Property Office, the entire disclosure of which is incorporated herein by reference for all purpose.

BACKGROUND

1. Field

The following description relates to a hall sensor or a hall effect sensor, and to a semiconductor-based hall sensor capable of decreasing offset voltage and improving hall voltage uniformity.

2. Description of Related Art

A hall sensor or a hall effect sensor is a device that detects direction and magnitude of a magnetic field by using the hall effect in which the magnetic field is applied to a conductor through which electrical current flows to generate voltage in a direction perpendicular to the electrical current and the magnetic field.

Hall sensors may be used to implement electronic compasses due to its ability to detect the direction and magnitude of a magnetic field, and semiconductor-based hall sensors are widely used. Here, a semiconductor-based hall sensor refers to a hall sensor implemented with a complementary metal-oxide semiconductor (CMOS).

In a conventional hall sensor or hall element, a sensing region is formed on a semiconductor substrate. The sensing region is typically formed in a cross shape when viewed from the top. Furthermore, electrodes are formed on the cross-shaped sensing region.

Accordingly, while a magnetic field is applied to the conventional hall sensor having the aforementioned configuration, two electrodes that face each other among four electrodes are used to detect electric current flow, and the other two electrodes are used to detect hall voltage generated in a direction perpendicular to the electrical current flow. In this way, the conventional hall sensor senses the hall voltage to determine the direction and magnitude of the magnetic field.

In an ideal hall element, when an external magnetic field is not applied, the hall voltage is zero (0). However, in an actual hall element, due to a problem of process accuracy, non-uniformity of internal electrical properties of the element, and asymmetry of hall electrodes, even when the external magnetic field does not exist, voltage is generated in small quantities. While the external magnetic field is not applied, output voltage generated when unit input current flows in the hall element is referred to as offset voltage.

However, in a conventional hall element having such a configuration, the cross-shaped sensing region causes deterioration of the process accuracy. For instance, since the cross shape has much more portions angulated at a right angle than other shapes, an electromagnetic field is considerably large at corners of the cross-shaped regions, causing high offset voltage. Thus, with such a conventional hall element, it is difficult to maintain uniformity of hall voltage.

SUMMARY

In one general aspect, there is provided a hall sensor including a hall element disposed on a semiconductor substrate, the hall element including: a first conductivity type sensing region configured to detect a change in a magnetic field, a first electrode and a third electrode that face each other and configured to measure electrical current on the sensing region, a second electrode and a fourth electrode that face each other and are arranged perpendicular to the first and third electrodes and are configured to measure a change in voltage, and a second conductivity type doped region disposed on the sensing region and covers a part of a surface of the semiconductor substrate, in which the sensing region has at least one angulated corner or rounded corner.

The sensing region may have at least one angulated corner, and a length of a side of the angulated corner may be shorter than lengths of adjacent sides of the sensing region.

The sensing region may have a rounded corner.

The second conductivity type doped region may have a higher dopant concentration than the sensing region.

The sensing region may be a magnetic sensing region.

The first electrode, the second electrode, the third electrode and the fourth electrode may be each an N type region with a higher dopant concentration than the sensing region.

The first electrode, the second electrode, the third electrode and the fourth electrode may be each arranged with a side having a longer length facing a center of the sensing region.

The first electrode, the second electrode, the third electrode and the fourth electrode may be arranged such that the sides having a longer length are at a 45 degree with respect to a tangent line of an outer circumferential surface of the sensing region.

Insulating layers may be formed to surround each of the first electrode, the second electrode, the third electrode and the fourth electrode.

The general aspect of the hall sensor may further include a P-type well disposed under the doped region outside the sensing region.

The sensing region may have a square shape or an octagon shape.

A dopant concentration of the sensing region may be in a range of $4E16 \leq N \leq 1E18$ (atoms/cm$^3$).

The side of the angulated corner may form a 135° angle with the adjacent sides of the sensing region.

In another general aspect, there is provided a hall sensor including: a plurality of hall elements disposed on a semiconductor substrate, in which the plurality of hall elements includes a pair of hall elements that includes two or more hall elements disposed adjacent to each other, and in which each of the hall elements include: a first conductivity type sensing region configured to detect a change in a magnetic field, first and third electrodes that face each other and are configured to measure electrical current on the sensing region, second and fourth electrodes that face each other and are arranged to be perpendicular to the first and third electrodes and are configured to measure a change in voltage, and a second conductivity type doped region disposed on the sensing region and covering a part of a surface of the semiconductor substrate, and in which the sensing region includes at least one angulated corner or a rounded corner.

The general aspect of the hall sensor may further include an integrated magnetic concentrator on the sensing region.

An entire upper surface of the integrated magnetic concentrator may be flat.

An upper surface of the integrated magnetic concentrator may be curved.

The plurality of hall elements may be arranged to protrude from an edge of the integrated magnetic concentrator in a cross-sectional view.

In yet another general aspect, there is provided a hall sensor including a hall element disposed on a semiconductor substrate, the hall element including: a sensing region of a first conductivity type; and a first electrode, a second electrode, a third electrode, and a fourth electrode disposed at corners of the sensing region, the first electrode and the second electrode facing each other, and the second electrode and the fourth electrode facing each other, in which the sensing region has at least one angulated corner or rounded corner.

The general aspect of the hall sensor may further include a doped region of a second conductivity type disposed on the sensing region, in which the sensing region has four angulated corners with a octagonal shape in a plan view.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Various examples of semiconductor-based hall sensors will now be described in detail with reference to the accompanying drawings.

As set forth above, according to examples below, in a semiconductor-based hall sensor, a N-type doped sensing region is formed in, for example, a square shape or an octagon shape to include at least one angulated or rounded corner, and four or more electrodes are formed on corners of the sensing region. Accordingly, it is possible to decrease the offset voltage, thereby improving the uniformity of hall voltage.

While the present disclosure describes various examples in detail, it will be apparent to those skilled in the art that modifications and variations can be made without departing from the spirit and scope of the present disclosure. Such modifications and variations are within the scope of the present disclosure.

Figure 1A:
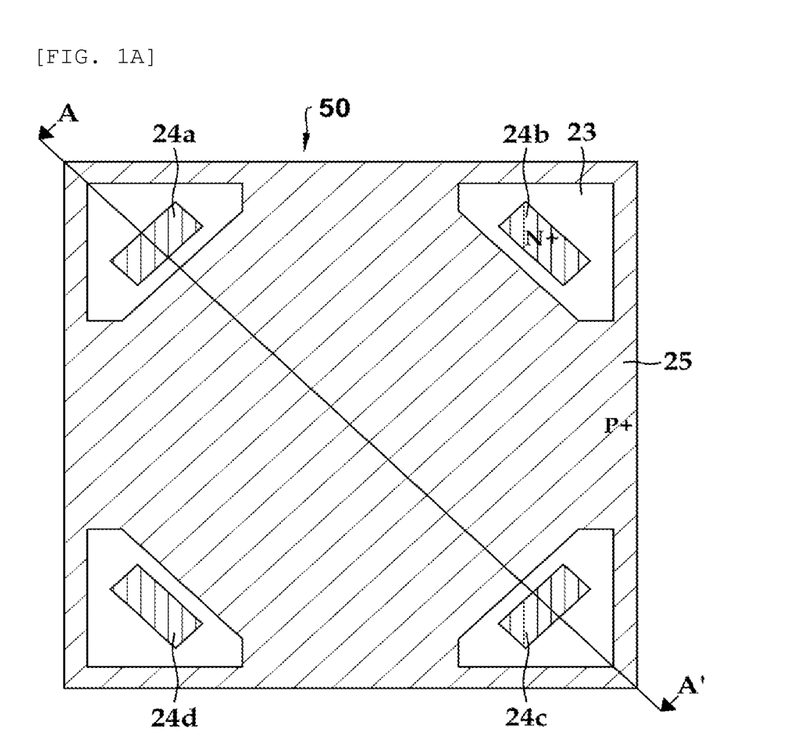
FIGS. 1A and 1B illustrate plan views of an example of a semiconductor-based hall sensor according to the present disclosure.
Figure 1B:
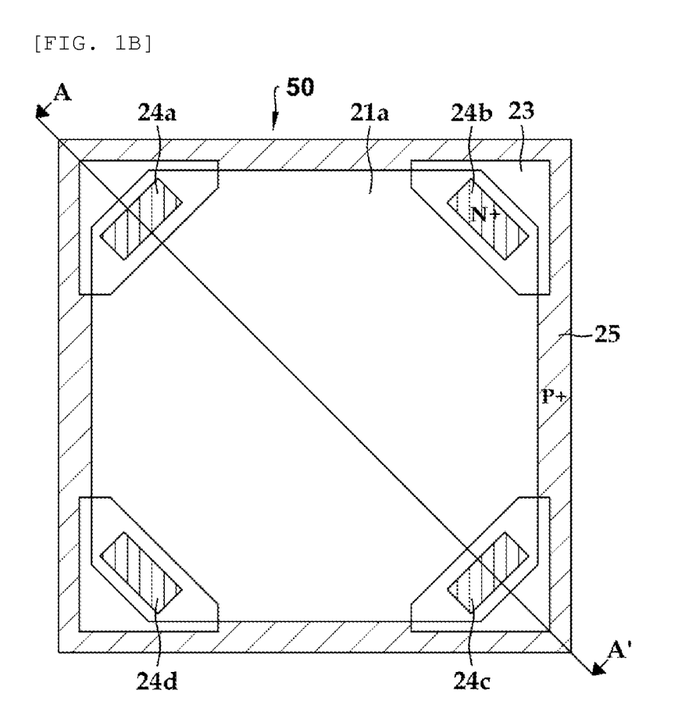

FIGS. 1A and 1B are plan views illustrating an example of a semiconductor-based hall element 50. In this example, the hall element 50 may be a hall element or a hall sensing element.

Referring to FIGS. 1A and 1B, in a semiconductor-based hall sensor, a semiconductor substrate 20 (see FIG. 4) is provided, and the hall element 50 is formed on the semiconductor substrate 20. The hall element 50 includes a sensing region 21a having an octagon shape when viewed from the top and first to fourth electrodes 24a, 24b, 24c, and 24d formed at four corner surfaces of the sensing region 21a by being doped as a high-concentration first conductivity (N+) type region.

Referring to FIG. 1A, the first and third electrodes 24a and 24c face each other to measure electrical current on the sensing region 21a, and the second and fourth electrodes 24b and 24d are arranged in a direction perpendicular to the first and third electrodes 24a and 24c and face each other to measure a change in voltage. In this example, lengths of the four corner surfaces on which the first to fourth electrodes 24a, 24b, 24c, and 24d are formed may be shorter than lengths of surfaces on which the first to fourth electrodes 24a, 24b, 24c, and 24d are not formed.

Referring to FIG. 1A, the first to fourth electrodes 24a, 24b, 24c, and 24d have a rectangular shape or a square shape. Referring to FIG. 1A, surfaces having a longer length of the rectangular shape are formed to form a 45 degree angle with respect to the tangent line of an outer circumferential side (outline) of the sensing region 21a. Accordingly, a large quantity of electrical current flows in the sensing region 21a, so that a fine change in voltage can be easily detected.

The semiconductor substrate 20 is a P-type doped region, and the sensing region 21a is a deep N well (also referred to as a DNW) region as an N-type doped region. In this example, the sensing region 21a may be a magnetic sensing region.

Furthermore, the first to fourth electrodes 24a, 24b, 24c, and 24d are doped to be a high-concentration N type region having a dopant concentration higher than that of the sensing region 21a. By doping the first to fourth electrodes 24a, 24b, 24c, and 24d to have a higher concentration than the sensing region 21a, it is possible to decrease resistance when a contact is formed with a contact plug (not shown).

Referring to FIG. 1A, the first to fourth electrodes 24a, 24b, 24c, and 24d are formed in a rectangular shape as shown in FIGS. 1A and 1B, and sides having a longer length of the rectangle are arranged to face a center of the sensing area.

Figure 4:
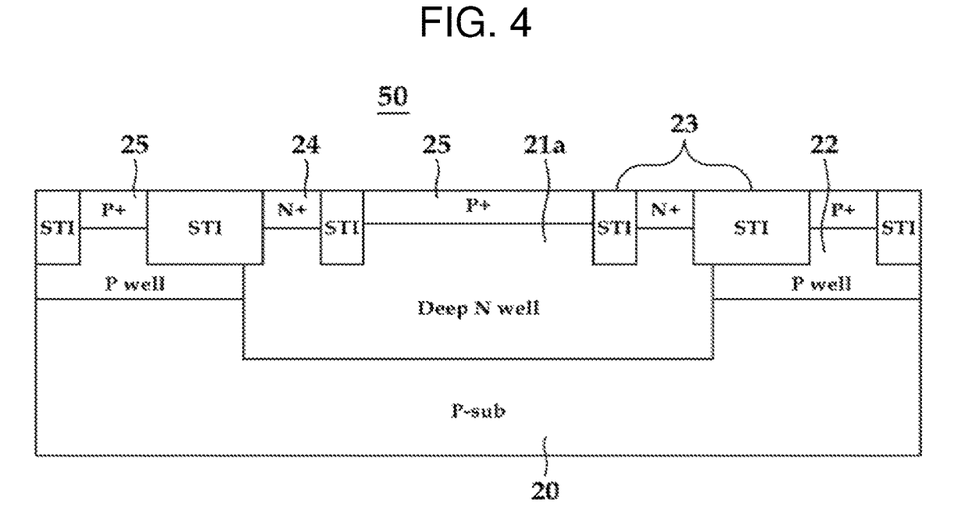
FIG. 4 illustrates a cross-sectional view of the example of semiconductor-based hall sensor illustrated in FIGS. 1A and 1B along line A-A.

In addition, referring to FIGS. 1A and 1B, high-concentration P-type doped regions 25 are formed on the sensing region 21a where the four first to fourth electrodes 24a, 24b, 24c, and 24d are formed. Accordingly, the second conductivity type (P-type) doped regions 25 are exposed at a surface of the substrate 20, as illustrated in FIG. 4. Referring to FIG. 4, the doped region 25 formed at an outer periphery is needed to apply voltage to a P-type well 22. To achieve this, the doped region 25 is formed as a high-concentration P-type impurity region with a dopant concentration higher than that of the P-type well 22. In this example, the second conductivity type doped region may be formed to have a dopant concentration relatively higher than that of the sensing region. By forming the second conductivity type doped region to have a higher dopant concentration, it is possible to suppress a depletion layer from expanding up to the surface of the substrate by a dose of the sensing region.

Referring to FIGS. 1B and 4, insulating layers 23 are formed between the four first to fourth electrodes 24a, 24b, 24c, and 24d and the doped region 25. Further, the insulating layers 23 surround the first to fourth electrodes 24a, 24b, 24c, and 24d to separate the first to fourth electrodes from the doped region 25.

The doped region 25 is formed to surround four sides of the four first to fourth electrodes 24a, 24b, 24c, and 24d. Referring to FIG. 4, the P-type well 22 is formed under the doped region 25 outside the sensing region 21a. By forming the P-type doped region 25 on the surface of the semiconductor substrate 20, a defect or non-uniformity of a semiconductor material of the deep N well sensing region 21a is offset to decrease offset voltage of the hall element. Accordingly, it is possible to simultaneously improve element characteristics and improve the uniformity of hall voltage.

Figure 2A:
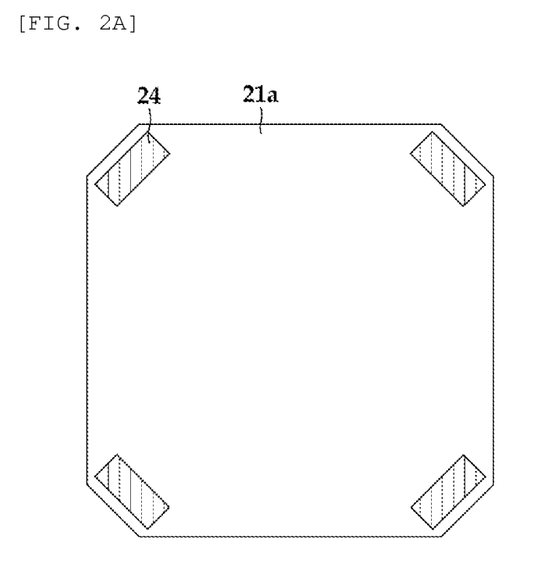
FIGS. 2A to 2C illustrate plan views of modified examples of the hall sensors illustrated in FIGS. 1A and 1B in which sensing regions have a square or an octagon shape.
Figure 2B:
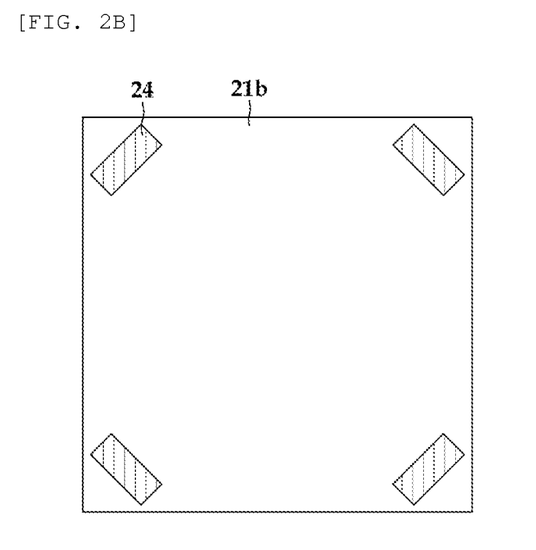
Figure 2C:
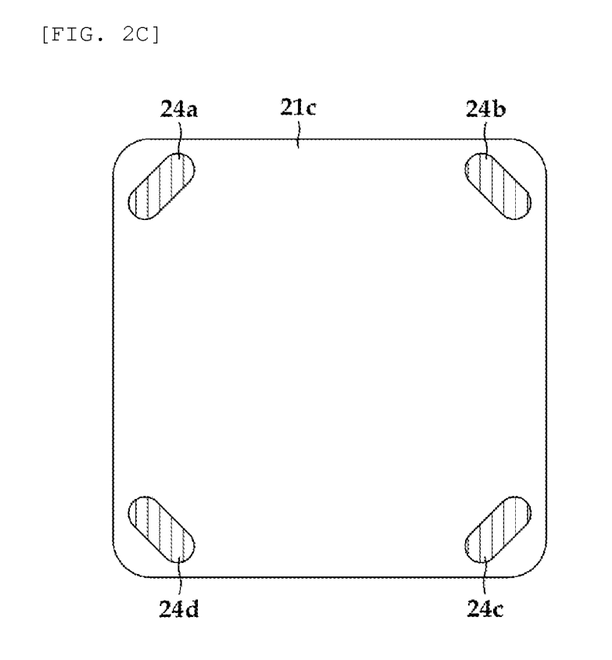

FIGS. 2A, 2B, and 2C are detailed plan views illustrating sensing regions formed in an octagon shape, a square shape, or a polygonal shape with rounded corners, respectively.

In one example of the present disclosure, as illustrated in FIG. 2A, the sensing region 21a having an octagon shape when viewed from the top may be formed on the semiconductor substrate 20 (see FIG. 4), and the four first to fourth electrodes 24a, 24b, 24c, and 24d may be formed at the four corners of the sensing region 21a. The first to fourth electrodes 24a, 24b, 24c, and 24d are formed in a rectangular shape as shown in FIG. 2A, and the sides having a longer length are arranged to face a center of the sensing region. Referring to FIG. 2A, four sides of the octagonal shape of the sensing region 21a may have a greater length than the other four sides. However, in another example, the eight sides of the octagonal shape may be equal in length.

Referring to FIG. 2B, in another example of the present disclosure, a sensing region 21b having a square shape when viewed from the top may be formed on the semiconductor substrate 20.

Referring to FIG. 2C, in still another example of the present disclosure, a sensing region 21c having a corner-rounded square shape when viewed from the top may be formed on the semiconductor substrate 20, and the four first to fourth electrodes 24a, 24b, 24c, and 24d may be formed at four corners of the sensing region 21c. The first to fourth electrodes 24a, 24b, 24c, and 24d may be formed in a round shape, an oblong shape with rounded corners, or an ellipse shape as illustrated in FIG. 2C. Referring to FIG. 2C, sides having a longer length are arranged to face a center of the sensing region.

Figure 3A:
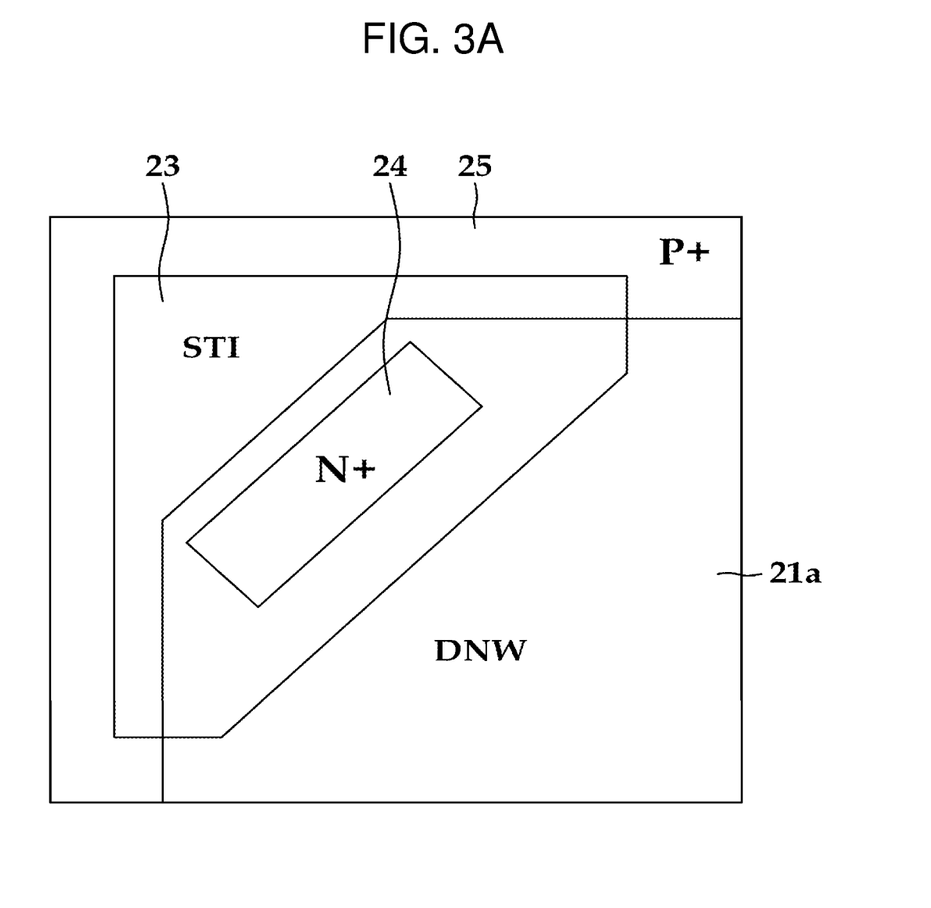
FIG. 3A illustrates a magnified plan view of electrodes illustrated in FIGS. 1A and 1B.

FIG. 3A is a detailed plan view illustrating electrodes shown in FIGS. 1A and 1B.

The insulating layers 23 are STI regions. The insulating layers 23 physically separate the first to fourth N-type electrodes 24a, 24b, 24c, and 24d from the P-type doped region 25. Furthermore, the high-concentration P-type doped region 25 surrounds the first to fourth N-type electrodes 24a, 24b, 24c, and 24d outside the insulating layer 23.

Accordingly, since the insulating layer 23 is formed between the first to fourth N-type electrodes 24a, 24b, 24c, and 24d and the P-type doped region 25, noises between the N-type region and the P-type region are decreased to decrease offset voltage of the hall element. Accordingly, it is possible to simultaneously improve element characteristics and improve hall voltage uniformity.

FIG. 4 is a cross-sectional view of the semiconductor-based hall element illustrated in FIGS. 1A and 1B along line A-A.

As shown in FIG. 3A, in the semiconductor-based hall element, an N-type doped sensing region 21a (deep N well: DNW) having an octagon shape may be provided as a magnetic sensing region on a P-type semiconductor substrate (P-sub) 20.

The sensing region 21a is formed to have concentration of $4E16 \le N \le 1E18$ (atoms/cm$^3$) by performing a well drive-in thermal treatment at a high temperature of 1000° C. or higher after injecting NW ions. By forming the sensing region having such a DNW doping profile, it is possible to decrease an offset voltage value in addition to hall voltage sensitivity characteristics so as to achieve an optimal magnetic sensing structure.

In addition, the P-type doped region 25 (P+region) is formed on the sensing region 21a, and the doped region 25 around the sensing region 21a is arranged to be connected to the P-type well 22 under the doped region 25.

By forming the P-type doped sensing region 21a on the surface of the substrate 20, defect or non-uniformity of the semiconductor material of the deep N well sensing region 21a is offset to decrease offset voltage of the hall element. Accordingly, it is possible to simultaneously improve element characteristics and the uniformity of hall voltage.

Figure 3B:
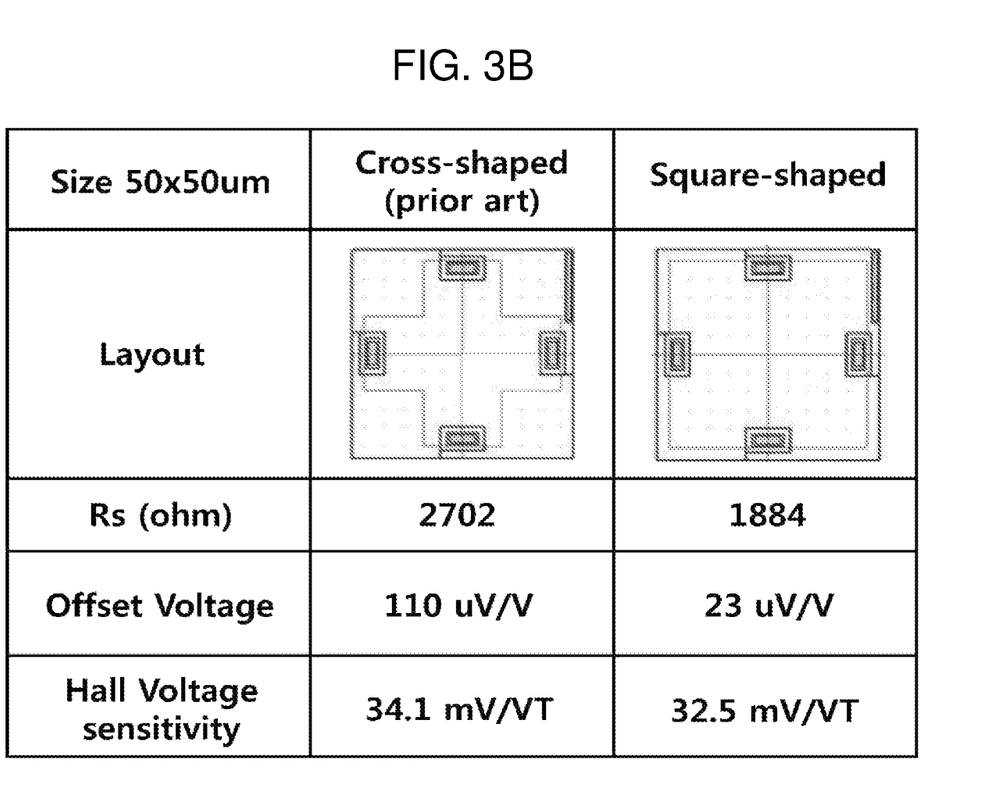
FIG. 3B illustrates a hall element having a cross-shaped sensing region and a hall element having a square-shaped sensing region whose characteristics are compared and summarized.

In FIG. 3B, the characteristics of a hall element having a cross-shaped sensing region and a hall element having a square-shaped sensing region are compared and summarized.

As illustrated in FIG. 3B, the hall element having a cross-shaped sensing region is slightly superior to the hall element having a square-shaped sensing region in hall voltage sensitivity characteristics. However, the hall element having a cross-shaped sensing region is considerably inferior to the hall element having a square-shaped sensing region in offset voltage characteristics. Thus, the structure of the hall element having a square-shaped sensing region may be further improved.

Figure 3C:
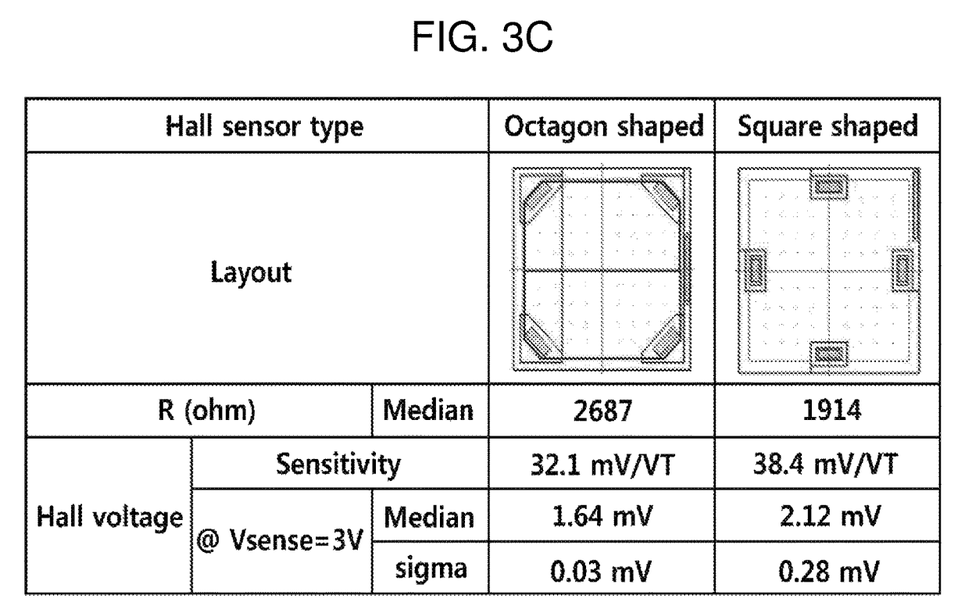
FIG. 3C illustrates a hall element having an octagon-shaped sensing region and a hall element having a square-shaped sensing region whose characteristics are compared and summarized.

Referring to FIG. 3C, the characteristics of a hall element having an octagon-shaped sensing region and a hall element having a square-shaped sensing region are compared and summarized.

Referring to FIG. 3C, the hall element having an octagon-shaped sensing region has an offset voltage of 80 μV/V, and the hall element having a square-shaped sensing region has an offset voltage of 23 μV/V. It can be seen that the offset voltage of the hall element having a square-shaped or octagon-shaped sensing region is lower than that of the hall element having a cross-shaped sensing region. This is because the square-shaped sensing region or the octagon-shaped sensing region has a cross sectional area greater than that of the cross-shaped sensing region.

As illustrated in FIG. 3C, it can be seen that in the case of sigma (standard deviation).

Figure 5:
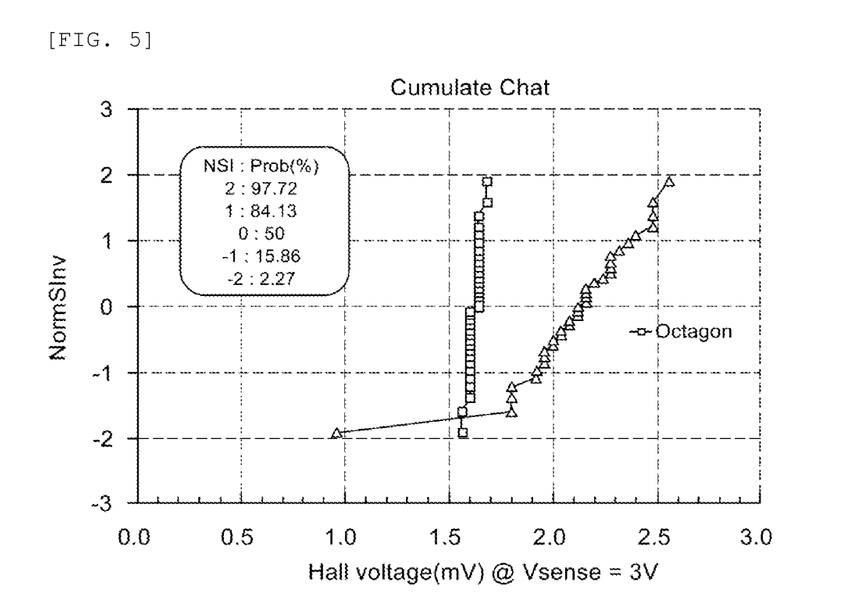
FIG. 5 is a graph comparing the uniformity of hall voltage of an example of a hall element having an octagon-shaped sensing region and an example of a hall element having a square-shaped sensing region.

Referring to FIG. 5, it can be seen that the hall element having a round shaped-sensing region or an octagon shaped-sensing region has a greatly improved distribution characteristic of hall voltage.

Based on an evaluation of results provided in FIG.3B, FIG.3C, and in the graph of FIG. 5, the hall element may be formed such that the N-type doped sensing region (namely, the magnetic sensing region) has a square shape or an octagon shape, so as to reduce the offset voltage of the hall element. By reducing the offset voltage, it is possible to simultaneously improve element characteristics and uniformity of hall voltage.

Figure 6:
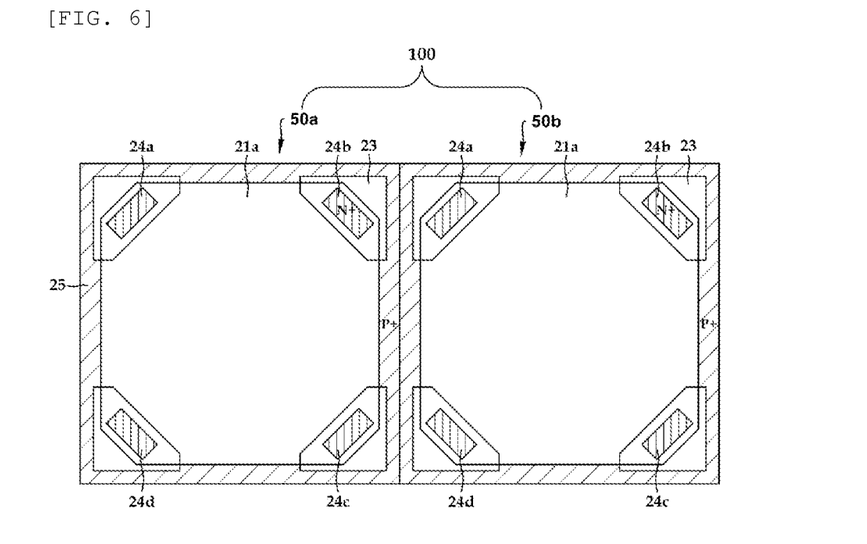
FIGS. 6 and 7 illustrate plan views of an example of a semiconductor-based hall sensor or magnetic sensor in which two hall elements according to the present disclosure are provided adjacent to each other on an integrated magnetic concentrator.
Figure 7:
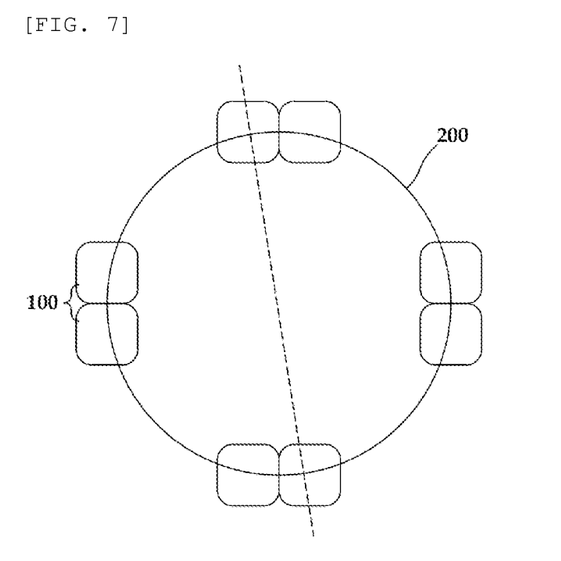

FIGS. 6 and 7 illustrate plan views of an example of a semiconductor-based hall sensor or magnetic sensor in which two hall elements according to the present disclosure are provided adjacent to each other on an integrated magnetic concentrator. By arranging the two hall elements to be adjacent to each other as illustrated in FIG. 6, it is possible to improve hall voltage sensitivity compared to a case in which only one hall element is used. Further, in another example, a first hall element 50a and a second hall element 50b may be formed separated from each other with a certain distance therebetween. Also, in yet another example, four hall elements may be arranged as one set. As the number of hall elements increases, it is possible to more easily adjust a change in hall voltage and offset voltage. This is because a change in magnetic force can be more sensitively detected depending on the arrangement and number of hall elements when magnetic flux in a vertical or horizontal direction reaches the hall element.

The semiconductor-based magnetic sensor (hereinafter, including a semiconductor sensor) refers to a sensor having a function of detecting a magnetic signal by using a semiconductor device, and is implemented with a plurality of hall elements combined with an integrated magnetic concentrator (IMC) having a magnetic amplifying function.

A digital compass or an electronic compass may be implemented by using such a magnetic sensor.

The magnetic sensor may be used to provide direction information by detecting a magnetic field of the earth, and is widely used in the field of cellular phones, radio sets, GPSs, PDAs, and automatic navigation systems.

Referring to FIGS. 6 and 7, in an example of the present disclosure, a plurality of hall elements 100 may be arranged such that two hall elements are adjacent to each other and eight hall elements 100 in total face each other on a circular-shaped integrated magnetic concentrator 200. The number of hall elements 100 may vary.

Referring to FIG. 7, the plurality of hall elements 100 is arranged such that two hall elements are adjacent to each other, and the plurality of hall elements 100 and the integrated magnetic concentrator 200 are arranged to be partially overlapped. In such a configuration, it is possible to maximize the intensity of a magnetic field in a vertical or horizontal direction. Thus, the ability to detect the magnetic field may be increased.

Figure 8A:
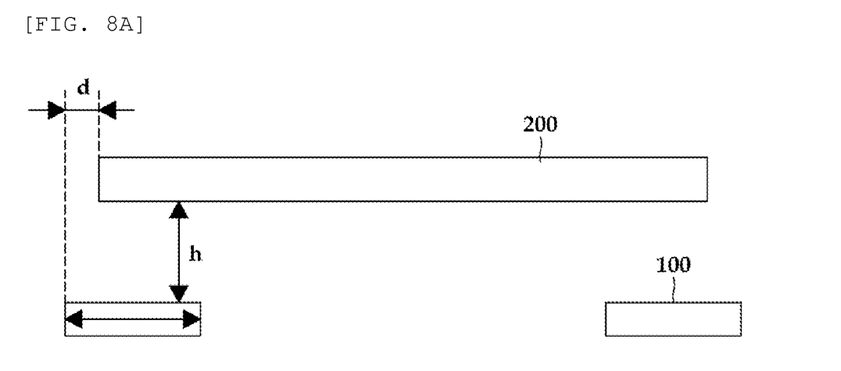
FIGS. 8A and 8B illustrate cross-sectional views that depict a relation between the arrangement of hall sensors and positions of ends of the integrated magnetic concentrator according to an example of the present disclosure.
Figure 8B:
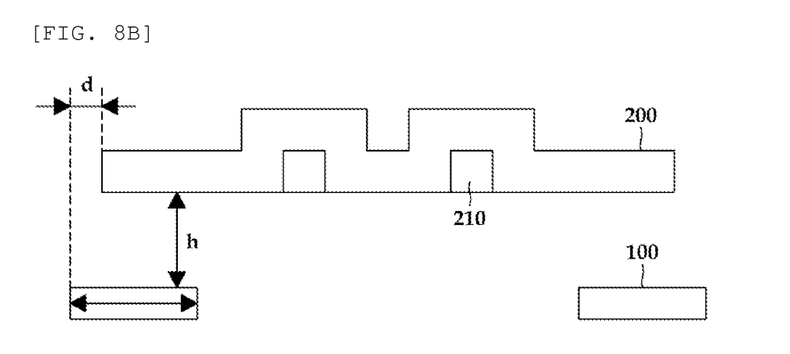

FIGS. 8A and 8B are detailed cross-sectional views of hall sensors and integrated magnetic concentrators according to examples of the present disclosure that illustrate a relation between the arrangement of hall sensors and the positions of ends of the integrated magnetic concentrators.

Referring to FIGS. 8A and 8B, a surface of the integrated magnetic concentrator 200 may be a flat surface or a curved surface.

Referring to FIG. 8B, a plurality of buffer films 210 including a buffer film or a polyimide film may be formed under the integrated magnetic concentrator 200, causing the surface of the integrated magnetic concentrator 200 to be a curved or uneven surface. At this time, by forming the surface of the integrated magnetic concentrator in a curved shape rather than a flat shape, it is possible to reduce stress or pressure exerted to the hall sensor or the hall element.

Furthermore, as illustrated in FIGS. 8A and 8B, the plurality of hall elements 100 may be arranged to protrude from the end of the integrated magnetic concentrator 200 by a certain distance d or to have a certain height h. In the examples illustrated in FIGS. 8A and 8B, the protruding distance d is set to be smaller than the height h.

By using such an arrangement condition, offset voltage of the hall sensor may be reduced, so that it is possible to improve element characteristics and to further improve the uniformity of hall voltage.

Provided herein is an example of a semiconductor-based hall sensor capable of decreasing offset voltage and improving hall voltage uniformity by forming a N-type doped sensing region so as to include at least one angulated or rounded corner and respectively forming a plurality of electrodes on corners of the sensing region to measure electrical current and a change in voltage.

There is also provided a semiconductor-based hall sensor including a hall element that is formed on a semiconductor substrate. The hall element may include a first conductive sensing region that detects a change in a magnetic field, first and third electrodes that face to each other to measure electrical current on the sensing region, second and fourth electrodes that are arranged to be perpendicular to the two first and third electrodes and face each other to measure a change in voltage, and a second conductive doped region that is formed on the sensing region and covers a part of a surface of the semiconductor substrate. Corner surfaces of the sensing region may include at least one angulated surface or rounded surface.

Lengths of the corner surfaces of the sensing region may be shorter than lengths of other surfaces. The sensing region may have a round shape or an ellipse shape. The second conductive doped region may have a dopant concentration relatively higher than that of the sensing region. The sensing region may be a magnetic sensing region.

The first to fourth electrodes may be doped to become an N type of a concentration higher than that of the sensing region. The first to fourth electrodes may be arranged so as to allow surfaces having a longer length to face a center of the sensing region. The first to fourth electrodes may be formed such that the surfaces having a longer length are formed to have 45 degrees with respect to the tangent line of an outer circumferential surface of the sensing region. Insulating layers may be formed to surround the first to fourth electrodes, respectively.

A P-type well may be formed under the doped region outside the sensing region. The sensing region may have a square shape or an octagon shape.

Also provided herein is an example of a semiconductor-based hall sensor including a plurality of hall elements that is formed on a semiconductor substrate. The plurality of hall elements may include a pair of hall elements that is constituted by two or more hall elements formed to be adjacent to each other. Each of the hall elements may include a first conductive sensing region that detects a change in a magnetic field, first and third electrodes that face each other to measure electrical current on the sensing region, second and fourth electrodes that are arranged to be perpendicular to the two first and third electrodes and face each other to measure a change in voltage, and a second conductive doped region that is formed on the sensing region and covers a part of a surface of the semiconductor substrate. Corner surfaces of the sensing region include at least one angulated or rounded surface.

The semiconductor-based hall sensor may further include an integrated magnetic concentrator on the sensing region. The entire surface of the integrated magnetic concentrator may be flat, or a surface of the integrated magnetic concentrator may be curved.

The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

While the expressions such as "first" or "second" can be used to refer to various elements, the elements are not limited by the expressions. The expressions are used only for the purpose of distinguishing one element from the other.

An expression in singular form encompasses plural meaning, unless otherwise specified. Throughout the description, the expression "comprise" or "have" is used only to designate the existence of characteristic, number, step, operation, element, component or a combination thereof which are described herein, but not to preclude possibility of existence of one or more of the other characteristics, numbers, steps, operations, elements, components or combinations of these or addition.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A hall sensor comprising a hall element disposed on a semiconductor substrate, the hall element comprising:
   a sensing region of N type conductivity configured to detect a change in a magnetic field,
   first and third electrodes of N type conductivity, facing each other, and configured to measure electrical current on the sensing region,
   second and fourth electrodes of N type conductivity, facing each other, arranged perpendicular to the first and third electrodes, and configured to measure a change in voltage, and
   a doped region of P type conductivity disposed on the sensing region and covering a part of a surface of the semiconductor substrate,
   wherein the sensing region has at least one angulated corner or rounded corner, and
   wherein each of the first to fourth electrodes of N type conductivity is surrounded by a shallow trench isolation (STI) to be separated from each other and separated from the doped region of P type conductivity.

2. The hall sensor according to claim 1, wherein the sensing region has the at least one angulated corner, and a length of a side of the angulated corner is shorter than lengths of adjacent sides of the sensing region, and
   wherein each of the first to fourth electrodes is formed at each of four corners of the sensing region.

3. The hall sensor according to claim 2, wherein the side of the angulated corner forms a 135° angle with the adjacent sides of the sensing region.

4. The hall sensor according to claim 1, wherein the doped region of P type conductivity has a higher dopant concentration than the sensing region.

5. The hall sensor according to claim 1, wherein the sensing region is a magnetic sensing region.

6. The hall sensor according to claim 1, wherein the first electrode, the second electrode, the third electrode and the fourth electrode each have a higher dopant concentration than the sensing region.

7. The hall sensor according to claim 1, wherein the first electrode, the second electrode, the third electrode and the fourth electrode each comprise a shorter length side and a longer length side, and are each arranged with the longer length side facing a center of the sensing region.

8. The hall sensor according to claim 7, wherein the first electrode, the second electrode, the third electrode and the fourth electrode are arranged such that the sides having a longer length are at a 45 degree angle with respect to a tangent line of an outer circumferential side of the sensing region.

9. The hall sensor according to claim 1, further comprising a P-type well disposed in the semiconductor substrate.

10. The hall sensor according to claim 1, wherein the sensing region has a square shape or an octagon shape.

11. The hall sensor according to claim 1, wherein a dopant concentration of the sensing region is in a range of $4E16 < N < 1E18$ (atoms/cm$^3$).

12. The hall sensor according to claim 1, wherein the doped region of P type conductivity surrounds the first to fourth electrodes.

13. The hall sensor according to claim 1, wherein the sensing region is between the doped region of P type conductivity and the semiconductor substrate in another part of the surface of the semiconductor substrate.

14. The hall sensor according to claim 1, wherein the doped region of P type conductivity extends over an edge of the sensing region.

15. A hall sensor comprising:
   hall elements disposed on a semiconductor substrate,
   wherein the hall elements comprise a pair of hall elements that includes two or more hall elements disposed adjacent to each other, and
   wherein each of the hall elements comprises:
   a sensing region of N type conductivity configured to detect a change in a magnetic field, first and third electrodes of N type conductivity, facing each other, and configured to measure electrical current on the sensing region, second and fourth electrodes of N type conductivity, facing each other, arranged to be perpendicular to the first and third electrodes, and configured to measure a change in voltage, and a doped region of P type conductivity disposed on the sensing region and covering a part of a surface of the semiconductor substrate, wherein the sensing region includes an angulated corner or a rounded corner, and wherein each of the first to fourth electrodes of N type conductivity is surrounded by a shallow trench isolation (STI) to be separated from each other and separated from the doped region of P type conductivity.

16. The hall sensor according to claim 15, further comprising an integrated magnetic concentrator (IMC) on the sensing region of each hall element.

17. The hall sensor according to claim 16, wherein an entire upper surface of the IMC is flat.

18. The hall sensor according to claim 16, wherein the IMC comprises a portion protruding from an upper surface of the IMC.

19. The hall sensor according to claim 16, wherein the hall elements are arranged to protrude from an edge of the IMC in a cross-sectional view.

20. The hall sensor according to claim 15, wherein the pair of hall elements directly contact each other.

21. A hall sensor comprising:
a hall element disposed on a semiconductor substrate, the hall element comprising:
a sensing region of a N type conductivity;
a first electrode, a second electrode, a third electrode, and a fourth electrode, each of the N type conductivity, disposed at respective corners of the sensing region, the first electrode and the third electrode facing each other, and the second electrode and the fourth electrode facing each other; and
a doped region of P type conductivity disposed on the sensing region,
wherein each of the first to fourth electrodes of N type conductivity is surrounded by a shallow trench isolation (STI) to be separated from each other and separated from the doped region of P type conductivity, and
wherein the sensing region has at least one angulated corner or a rounded corner.

22. The hall sensor according to claim 21, wherein the sensing region has four angulated corners with an octagonal shape in a plan view.

23. A hall sensor comprising a hall element disposed on a semiconductor substrate, the hall element comprising:
a sensing region of P type conductivity configured to detect a change in a magnetic field,
first and third electrodes of P type conductivity, facing each other, and configured to measure electrical current on the sensing region,
second and fourth electrodes of P type conductivity, facing each other, arranged perpendicular to the first and third electrodes, and configured to measure a change in voltage, and
a doped region of N type conductivity disposed on the sensing region and covering a part of a surface of the semiconductor substrate,
wherein the sensing region has at least one angulated corner or rounded corner, and
wherein each of the first to fourth electrodes of P type conductivity is surrounded by a shallow trench isolation (STI) to be separated from each other and separated from the doped region of N type conductivity.

24. A hall sensor comprising:
hall elements disposed on a semiconductor substrate,
wherein the hall elements comprise a pair of hall elements that includes two or more hall elements disposed adjacent to each other, and
wherein each of the hall elements comprises:
a sensing region of P type conductivity configured to detect a change in a magnetic field,
first and third electrodes of P type conductivity, facing each other, and configured to measure electrical current on the sensing region,
second and fourth electrodes of P type conductivity, facing each other, arranged to be perpendicular to the first and third electrodes, and configured to measure a change in voltage, and
a doped region of N type conductivity disposed on the sensing region and covering a part of a surface of the semiconductor substrate,
wherein the sensing region includes an angulated corner or a rounded corner, and
wherein each of the first to fourth electrodes of P type conductivity is surrounded by a shallow trench isolation (STI) to be separated from each other and separated from the doped region of N type conductivity.

* * * * *